United States Patent
Shi et al.

(10) Patent No.: US 12,082,481 B2
(45) Date of Patent: Sep. 3, 2024

(54) FLEXIBLE DISPLAY DEVICE AND ELECTRONIC DEVICE

(71) Applicant: BOE Technology Group Co., Ltd., Beijing (CN)

(72) Inventors: Shiming Shi, Beijing (CN); Zhao Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 770 days.

(21) Appl. No.: 17/262,004

(22) PCT Filed: Mar. 27, 2020

(86) PCT No.: PCT/CN2020/081758
§ 371 (c)(1),
(2) Date: Jan. 21, 2021

(87) PCT Pub. No.: WO2021/189440
PCT Pub. Date: Sep. 30, 2021

(65) Prior Publication Data
US 2021/0376268 A1    Dec. 2, 2021

(51) Int. Cl.
*H10K 59/40*    (2023.01)
*H10K 50/86*    (2023.01)
(Continued)

(52) U.S. Cl.
CPC .......... *H10K 77/111* (2023.02); *H10K 50/86* (2023.02); *H10K 59/40* (2023.02); *H10K 2102/311* (2023.02)

(58) Field of Classification Search
CPC ...... H10K 77/111; H10K 59/40; H10K 50/86; H10K 2102/311
(Continued)

(56) References Cited

U.S. PATENT DOCUMENTS 10,295,818 B2    5/2019  Nam et al.
10,608,200 B2    3/2020  Liu et al.
(Continued)

FOREIGN PATENT DOCUMENTS

CN    104680941 A    6/2015
CN    106530973 A    3/2017
(Continued)

OTHER PUBLICATIONS

First Examination Report for Indian patent application No. 202147058874, dated Dec. 2, 2022, 6 pages.
(Continued)

*Primary Examiner* — Didarul A Mazumder
(74) *Attorney, Agent, or Firm* — Westman, Champlin & Koehler, P.A.

(57) ABSTRACT

A flexible display device and an electronic device are provided. The flexible display device includes: a flexible display panel; a plurality of functional members on a side of the flexible display panel, including a first functional member, a second functional member, and a third functional member; a back film on the other side of the flexible display panel; a supporting member on a side of the back film away from the flexible display panel; and a plurality of adhesive layers, including a first adhesive layer, a second adhesive layer, a third adhesive layer, a fourth adhesive, and a fifth adhesive layer. The third functional member includes a touch module including a touch substrate, a sensor layer, and an adhesive material layer between the sensor layer and the touch substrate, the modulus of the adhesive material layer is not less than the modulus of each of five adhesive layers.

19 Claims, 6 Drawing Sheets

(51) Int. Cl.
  *H10K 77/00* (2023.01)
  *H10K 77/10* (2023.01)
  *H10K 102/00* (2023.01)

(58) Field of Classification Search
  USPC .................................... 257/40; 438/82, 99
  See application file for complete search history.

(56) References Cited

U.S. PATENT DOCUMENTS

| | | | |
|---|---|---|---|
| 10,664,082 | B2 | 5/2020 | Kato |
| 11,119,597 | B2 | 9/2021 | Yu et al. |
| 11,127,319 | B2 | 9/2021 | Li et al. |
| 11,591,257 | B2 | 2/2023 | Chaparala et al. |
| 2015/0147532 | A1 | 5/2015 | Nam et al. |
| 2015/0357597 | A1 | 12/2015 | Wang |
| 2016/0226021 | A1* | 8/2016 | Lee ................... H10K 50/84 |
| 2017/0153668 | A1 | 6/2017 | Jang et al. |
| 2018/0157125 | A1* | 6/2018 | Yasui ............... G02F 1/133528 |
| 2018/0301660 | A1 | 10/2018 | Liu et al. |
| 2019/0073073 | A1 | 3/2019 | Kato |
| 2019/0115547 | A1* | 4/2019 | Lee ................... B32B 27/281 |
| 2019/0177577 | A1 | 6/2019 | Yamasaki et al. |
| 2019/0293921 | A1 | 9/2019 | Nam et al. |
| 2019/0384111 | A1 | 12/2019 | Lee et al. |
| 2020/0031710 | A1 | 1/2020 | Chaparala et al. |
| 2020/0234616 | A1* | 7/2020 | Ha ................... H04M 1/0268 |
| 2020/0251025 | A1 | 8/2020 | Li et al. |
| 2020/0251679 | A1* | 8/2020 | Ha ....................... B32B 3/30 |
| 2020/0266368 | A1* | 8/2020 | Park ................... H10K 50/87 |
| 2020/0401259 | A1 | 12/2020 | Yu et al. |
| 2021/0319200 | A1* | 10/2021 | Kim ................... G06V 40/1306 |

FOREIGN PATENT DOCUMENTS

| | | |
|---|---|---|
| CN | 106710449 A | 5/2017 |
| CN | 110675755 A | 1/2020 |
| JP | 2018027995 A | 2/2018 |
| JP | 2018200355 A | 12/2018 |
| JP | 2019045767 A | 3/2019 |
| JP | 2020515503 A | 5/2020 |
| KR | 20190030912 A | 3/2019 |
| KR | 20190088396 A | 7/2019 |
| KR | 20200007236 A | 1/2020 |
| WO | 2018153035 A1 | 8/2018 |

OTHER PUBLICATIONS

Notice of Reasons for Refusal, for Japanese Patent Application No. 2021-568079, dated Oct. 2, 2023, 5 pages.
Japanese Decision to Grant a Patent, for Japanese Patent Application No. 2021-568079, dated Jan. 9, 2024, 6 pages.
Hearing Notice, for Indian Patent Application No. 202147058874, dated Apr. 7, 2024, 3 pages.

* cited by examiner

FLEXIBLE DISPLAY DEVICE AND ELECTRONIC DEVICE

CROSS-REFERENCE TO RELATED APPLICATION

This application is a Section 371 National Stage Application of International Application No. PCT/CN2020/081758, filed on Mar. 27, 2020, entitled "FLEXIBLE DISPLAY DEVICE AND ELECTRONIC DEVICE", the whole disclosure of which is incorporated herein by reference.

TECHNICAL FIELD

The present disclosure relates to the field of display technology, in particular to a flexible display device and an electronic device.

BACKGROUND

A display device may display various images through a display screen to provide information to the user. Generally, the display device displays information through the display screen assigned to it. In recent years, a flexible display device using a flexible display panel has been developed. Unlike a rigid display device, the flexible display device is designed to be folded, curled or bent like paper. Regardless of the existing screen size, the flexible display device whose shape is changed in various ways is portable, thereby improving user convenience. As for the flexible display device, how to improve its folding reliability is one of the issues that those skilled in the art continue to pay attention to.

The above information disclosed in this section is only for the understanding of the background of the inventive concept of the present disclosure, therefore, the above information may contain information that does not constitute the prior art.

SUMMARY

In one aspect, a flexible touch panel is provided, including: a flexible display panel; a plurality of functional members on a side of the flexible display panel, wherein the plurality of functional members includes a first functional member, a second functional member, and a third functional member, the first functional member, the second functional member and the third functional member are sequentially stacked on the flexible display panel, and the third functional member is closer to the flexible display panel than the first functional member; a back film on the other side of the flexible display panel; a supporting member on a side of the back film away from the flexible display panel; and a plurality of adhesive layers, the plurality of adhesive layers including: a first adhesive layer between the first functional member and the second functional member; a second adhesive layer between the second functional member and the third functional member; a third adhesive layer between the third functional member and the flexible display panel; a fourth adhesive layer between the flexible display panel and the back film; and a fifth adhesive layer between the back film and the supporting member, wherein the third functional member includes a touch module, and the touch module includes a touch substrate, a sensor layer on the touch substrate, and an adhesive material layer between the sensor layer and the touch substrate, and wherein the modulus of the adhesive material layer is not less than the modulus of each of the first adhesive layer, the second adhesive layer, the third adhesive layer, the fourth adhesive layer and the fifth adhesive layer.

According to exemplary embodiments, the modulus of the adhesive material layer is more than eight times the modulus of each of the first adhesive layer, the third adhesive layer, the fourth adhesive layer and the fifth adhesive layer.

According to exemplary embodiments, the modulus of the adhesive material layer is equal to the modulus of the second adhesive layer.

According to exemplary embodiments, the modulus of the adhesive material layer at 20° C. is greater than 500 KPa.

According to exemplary embodiments, the modulus of the adhesive material layer at 20° C. is approximately in a range of 830~930 KPa.

According to exemplary embodiments, the first functional member includes a first protective film, a second protective film, and an intermediate adhesive layer between the first protective film and the second protective film, and the modulus of the intermediate adhesive layer is less than the modulus of the adhesive material layer.

According to exemplary embodiments, the modulus of the third adhesive layer is less than the modulus of the second adhesive layer.

According to exemplary embodiments, the modulus of the first adhesive layer is greater than the modulus of the intermediate adhesive layer.

According to exemplary embodiments, the modulus of the third adhesive layer is greater than the modulus of each of the intermediate adhesive layer, the first adhesive layer, the fourth adhesive layer and the fifth adhesive layer.

According to exemplary embodiments, the modulus of the intermediate adhesive layer, the modulus of the fourth adhesive layer, and the modulus of the fifth adhesive layer are equal to one another.

According to exemplary embodiments, the modulus of the fourth adhesive layer at 20° C. and the modulus of the fifth adhesive layer at 20° C. are both less than 30 KPa.

According to exemplary embodiments, the modulus of the third adhesive layer at 20° C. is approximately in a range of 100~120 KPa; and/or the modulus of the first adhesive layer at 20° C. is approximately in a range of 40~60 KPa; and/or the modulus of each of the intermediate adhesive layer, the fourth adhesive layer, and the fifth adhesive layer at 20° C. is approximately in a range of 20~40 KPa.

According to exemplary embodiments, each of the intermediate adhesive layer, the first adhesive layer, the adhesive material layer, the third adhesive layer, and the fifth adhesive layer includes a transparent optical adhesive; and/or each of the second adhesive layer and the fourth adhesive layer includes pressure-sensitive adhesive.

According to exemplary embodiments, the thickness of the adhesive material layer is not greater than the thickness of each of the intermediate adhesive layer, the first adhesive layer, the second adhesive layer, the third adhesive layer, the fourth adhesive layer, and the fifth adhesive layer.

According to exemplary embodiments, the thickness of each of the intermediate adhesive layer, the first adhesive layer, the third adhesive layer, the fourth adhesive layer, and the fifth adhesive layer is more than two times the thickness of the adhesive material layer.

According to exemplary embodiments, the thickness of the adhesive material layer is equal to the thickness of the second adhesive layer.

According to exemplary embodiments, the thickness of each of the adhesive material layer and the second adhesive layer is approximately in a range of 10~20 microns; and/or the thickness of each of the intermediate adhesive layer, the first adhesive layer, the third adhesive layer, and the fifth adhesive layer is approximately in a range of 40~60 microns; and/or the thickness of the fourth adhesive layer is approximately in a range of 20~30 microns.

According to exemplary embodiments, a material of the touch substrate includes cyclic olefin copolymer or tri-cellulose acetate, the thickness of the touch substrate is approximately in a range of 20~30 microns, and the modulus of the touch substrate at 20° C. is approximately in a range of 2~4 GPa.

According to exemplary embodiments, the first protective film and the second protective film include polyimide material or polyethylene terephthalate material, the thickness of the first protective film is approximately in a range of 75~85 microns, and the modulus of the first protective film at 20° C. is approximately in a range of 6~7 GPa.

According to exemplary embodiments, the second functional member includes a polarizer, the thickness of the polarizer is approximately in a range of 60~90 microns, and the modulus of the polarizer at 20° C. is approximately in a range of 2~4 GPa.

According to exemplary embodiments, the back film includes polyimide material or polyethylene terephthalate material, the thickness of the back film is approximately in a range of 40~60 microns, and the modulus of the back film at 20° C. is approximately in a range of 2~4 GPa.

According to exemplary embodiments, the supporting member includes metal material, the thickness of the supporting member is approximately in a range of 25~35 microns, and the modulus of the supporting member at 20° C. is approximately in a range of 100~200 GPa.

In another aspect, an electronic device is provided, including the display device as described above.

BRIEF DESCRIPTION OF THE DRAWINGS

By describing in detail exemplary embodiments of the present disclosure with reference to accompanying drawings, the features and advantages of the present disclosure will become more apparent.

FIGS. 2 and 3 are respectively side views showing a folded state of the display device of FIG. 1, wherein FIG. 2 shows that the display device according to the exemplary embodiments of the present disclosure may be folded or bent inward with respect to a bending axis, and FIG. 3 shows that the display device according to the exemplary embodiments of the present disclosure may be folded or bent outward with respect to the bending axis;

DETAILED DESCRIPTION OF EMBODIMENTS

Figure 1:
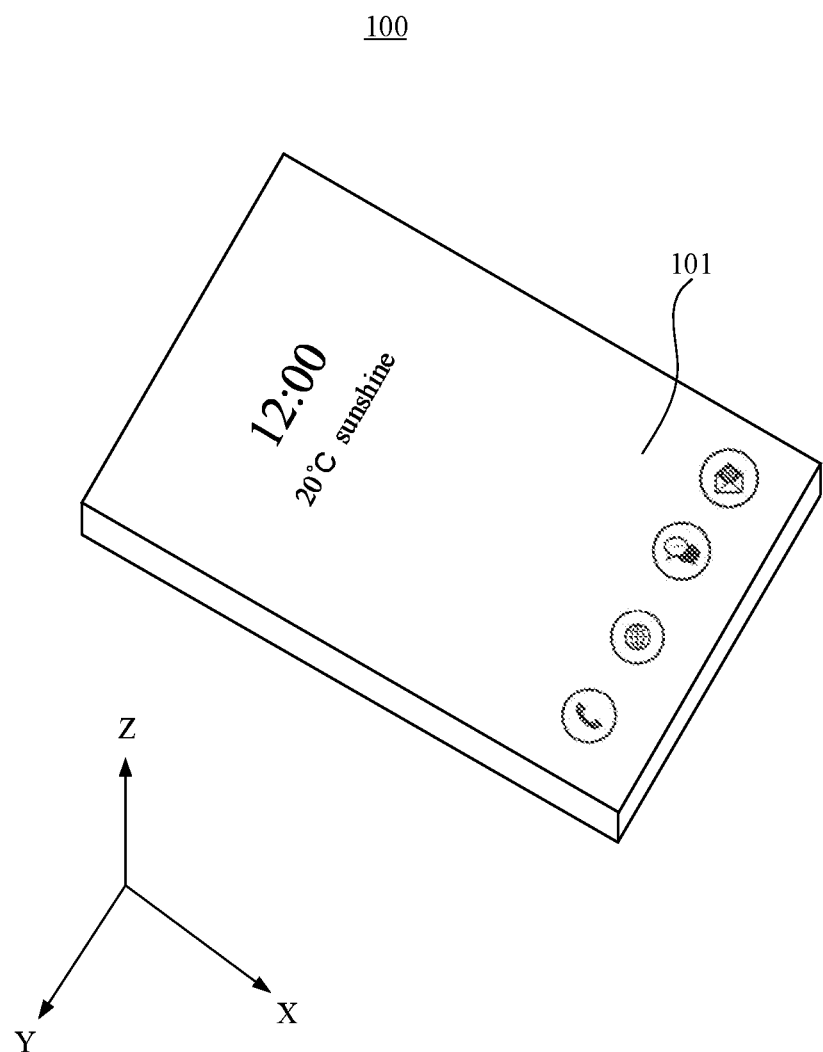
FIG. 1 is a perspective view showing a display device according to some exemplary embodiments of the present disclosure.

In order to make the objectives, technical solutions, and advantages of the embodiments of the present disclosure clearer, the technical solutions of the embodiments of the present disclosure will be described clearly and completely in conjunction with the accompanying drawings. Obviously, the described embodiments are part of the embodiments of the present disclosure, rather than all of the embodiments. Based on the described embodiments of the present disclosure, all other embodiments obtained by those skilled in the art without creative work are within the protection scope of the present disclosure.

It should be noted that, in the drawings, for clarity and/or description purposes, the size and relative size of elements may be enlarged. As such, the size and relative size of each element need not be limited to those shown in the drawings. In the specification and drawings, the same or similar reference numerals indicate the same or similar components.

When an element is described as being "on", "connected to" or "coupled to" another element, the element may be directly on the another element, directly connected to the another element, or directly coupled to the other element, alternatively, there may be an intermediate element between the element and the another element. However, when an element is described as being "directly on", "directly connected to" or "directly coupled to" another element, there are no intermediate elements. Other terms and/or expressions used to describe the relationship between elements should be interpreted in a similar manner, for example, "between" vs. "directly between", "adjacent" vs. "directly adjacent", or "above" versus "directly above". In addition, a term "connection" may refer to a physical connection, an electrical connection, a communication connection, and/or a fluid connection. In addition, the X axis, the Y axis, and the Z axis are not limited to the three axes of the rectangular coordinate system, and may be interpreted in a broader meaning. For example, the X axis, Y axis, and Z axis may be perpendicular to one another, or may represent different directions that are not perpendicular to one another. For the purpose of the present disclosure, "at least one of X, Y, and Z" and "at least one selected from the group consisting of X, Y, and Z" may be interpreted as only X, only Y, only Z, or any combination of two or more of X, Y, and Z such as XYZ, XYY, YZ, and ZZ. As used herein, a term "and/or" includes any and all combinations of one or more of the listed related items.

It should be noted that although terms "first", "second", etc. may be used herein to describe various components, members, elements, regions, layers and/or parts, these components, members, elements, regions, and layers and/or parts should not be limited by these terms. Rather, these terms are used to distinguish one component, member, element, region, layer, and/or part from another component, member, element, region, layer, and/or part. Thus, for example, the first component, the first member, the first element, the first region, the first layer and/or the first part discussed below may be referred to as the second component, the second member, the second element, the second region, the second layer and/or the second part without departing from the teachings of the present disclosure.

For ease of description, spatial relationship terms, for example, "up", "down", "left", "right", etc. may be used herein to describe the relationship between one element or feature and another element or feature as shown in the drawings. It should be understood that the spatial relationship terms are intended to cover different orientations of the device in use or operation in addition to covering orientations described in the drawings. For example, if the devices in the drawings are turned upside down, elements described as "below" or "beneath" other elements or features would be oriented "above" or "on" the other elements or features.

Those skilled in the art should understand that in this context, unless otherwise specified, expressions "height" or "thickness" refers to a size in a direction perpendicular to a surface of each layer of a display panel, that is, in a light emitting direction of the display panel. The size is also referred to as the size in a normal direction of the display device, or as the size in the Z direction in the drawings.

In this context, a term "modulus" refers to a ratio of stress to strain of a material in a stressed state, that is, it refers to the modulus of elasticity or Young's modulus. The modulus may be regarded as an index to measure the difficulty of elastic deformation of the material. As a value of the modulus becomes larger, the stress that causes the material to undergo a certain elastic deformation becomes larger, that is, the material stiffness is larger. In other words, as the value of the modulus becomes larger, the elastic deformation of the material becomes smaller under a certain stress. It should be understood that the modulus is related to temperature, and the relationship between the modulus and the temperature changes as the material changes.

In this context, an optically clear adhesive (abbreviated as OCA) is a transparent optical adhesive which is colorless and transparent. Moreover, the light transmittance of the transparent optical adhesive is more than 90%, a bonding strength thereof is good, and it is curable at normal temperature or medium temperature. A pressure sensitive adhesive (abbreviated as PSA) is an adhesive that is sensitive to pressure. For example, it may be used to prepare a pressure-sensitive adhesive tape.

In this context, unless otherwise specified, an expression "normal temperature" refers to a temperature around 20° C.

In this context, unless otherwise specified, an abbreviation "COP" refers to cyclic olefin copolymer, an abbreviation "TAC" refers to tri-cellulose acetate, and an abbreviation "PET" refers to polyethylene terephthalate.

Exemplary embodiments of the present disclosure provide a flexible display device comprising: a flexible display panel; a plurality of functional members on a side of the flexible display panel, wherein the plurality of functional members comprises a first functional member, a second functional member, and a third functional member, the first functional member, the second functional member and the third functional member are sequentially stacked on the flexible display panel, and the third functional member is closer to the flexible display panel than the first functional member; a back film on the other side of the flexible display panel; a supporting member on a side of the back film away from the flexible display panel; and a plurality of adhesive layers, the plurality of adhesive layers comprising: a first adhesive layer between the first functional member and the second functional member; a second adhesive layer between the second functional member and the third functional member; a third adhesive layer between the third functional member and the flexible display panel; a fourth adhesive layer between the flexible display panel and the back film; and a fifth adhesive layer between the back film and the supporting member, wherein the third functional member comprises a touch module, and the touch module comprises a touch substrate, a sensor layer on the touch substrate, and an adhesive material layer between the sensor layer and the touch substrate, and wherein the modulus of the adhesive material layer is not less than the modulus of each of the first adhesive layer, the second adhesive layer, the third adhesive layer, the fourth adhesive layer and the fifth adhesive layer. With such structural design and modulus design, the display device may realize R3 inward bend and R5 outward bend, and have high bending reliability.

FIG. 1 is a perspective view showing a display device 100 according to some exemplary embodiments of the present disclosure. Referring to FIG. 1, the display device 100 includes a display surface 101 on which information such as texts and images may be displayed. The display surface 101 is substantially parallel to a surface defined by a first direction X and a second direction Y. A third direction Z indicates a normal direction of the display surface 101, that is, a thickness direction of the display device 100.

The display device 100 according to the exemplary embodiments of the present disclosure may be a foldable display device or a rollable display device, that is, the display device 100 may be a flexible display device. The display device 100 may undergo various deformations by external force, for example, unfolding, curling, or folding.

For example, as shown in FIG. 1, the display device 100 may have an unfolded shape in a first mode. The first mode may be operated or may be used (for example, for a specific time or for a specific purpose), and may be an unfolded state of the display device 100. That is, FIG. 1 is a perspective view showing the unfolded state of the display device according to the embodiments of the present disclosure. In the first mode, the display device 100 may have a rectangular shape, and the rectangular shape has a hexahedral structure. However, the embodiments of the present disclosure are not limited thereto. In other embodiments, in the first mode, the display device 100 may have various shapes such as a circle or a triangle.

Figure 2:
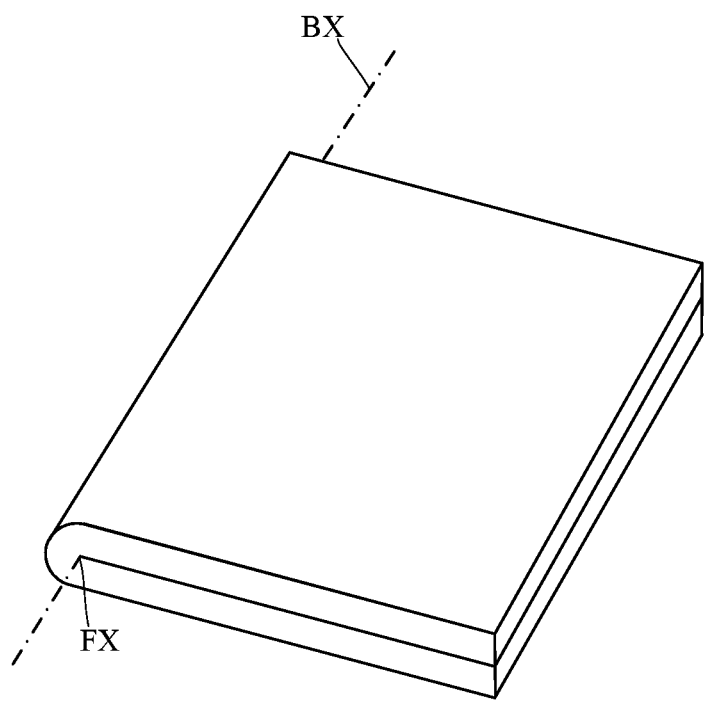
Figure 2:
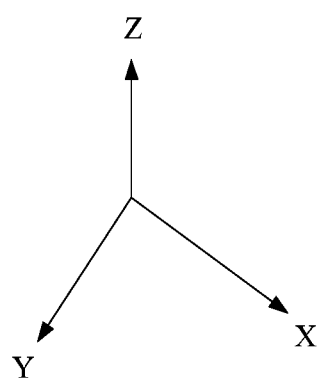
Figure 3:
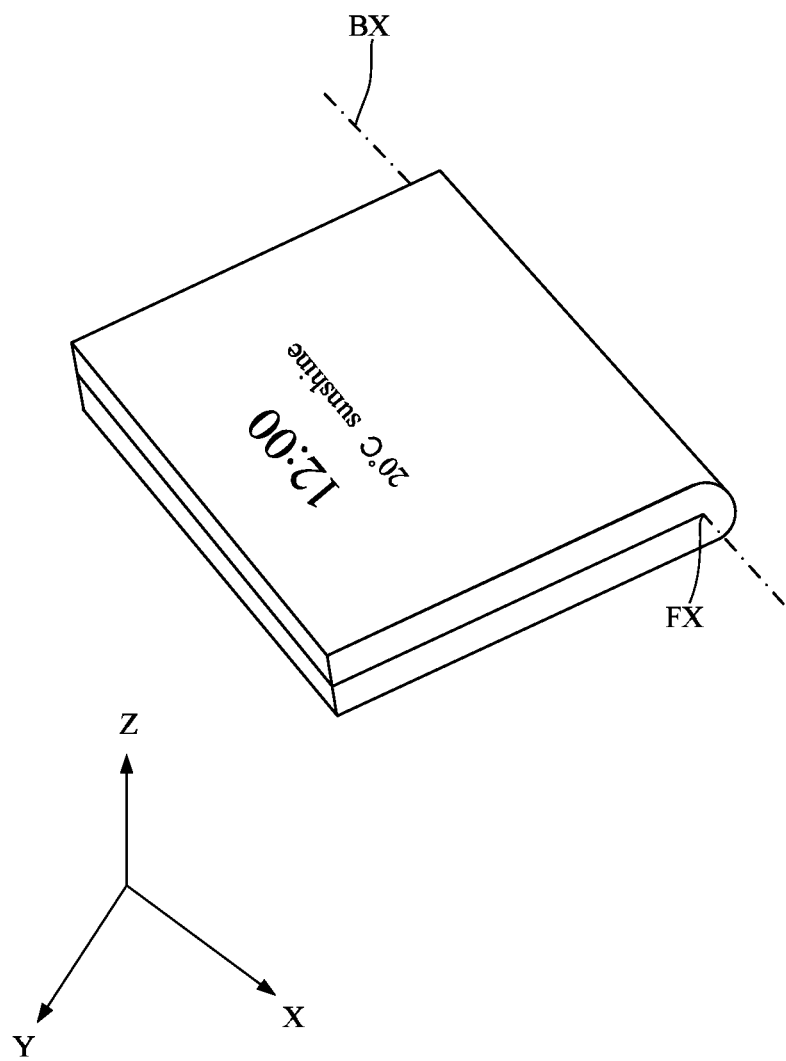

The display device 100 may be bent or folded along a bending axis BX. The bending axis BX may be an imaginary line and may be parallel to the display surface of the display device 100. FIGS. 2 and 3 are side views showing a folded state of the display device of FIG. 1. Referring to FIG. 2, the display device 100 according to some exemplary embodiments of the present disclosure may be folded or bent inward (i.e., inward bend) with respect to the bending axis BX, so that a part and another part of the display surface 101 shown in FIG. 1 may face each other. Referring to FIG. 3, the display device 100 according to some exemplary embodiments of the present disclosure may be folded or bent outward (i.e., outward bend) with respect to the bending axis BX, so that a part and another part of the display surface 101 shown in FIG. 1 may be opposite to each other.

For example, the display device 100 may be bent or folded to have a predetermined radius of curvature. The radius of curvature may be defined as the shortest distance between the center of curvature FX and the display device 100. The center of curvature FX may be a point through which the bending axis BX passes. For example, the radius of curvature may be the shortest distance from the center of curvature FX to an inner surface of the display device 100.

In the embodiments of the present disclosure, the display device 100 may realize R3 inward bend and R5 outward bend, that is, when the display device 100 is in the inwardly folded state shown in FIG. 2, the minimum radius of curvature may reach about 3 mm; when the display device 100 is in the outwardly folded state shown in FIG. 3, the minimum radius of curvature may reach about 5 mm.

Figure 4:
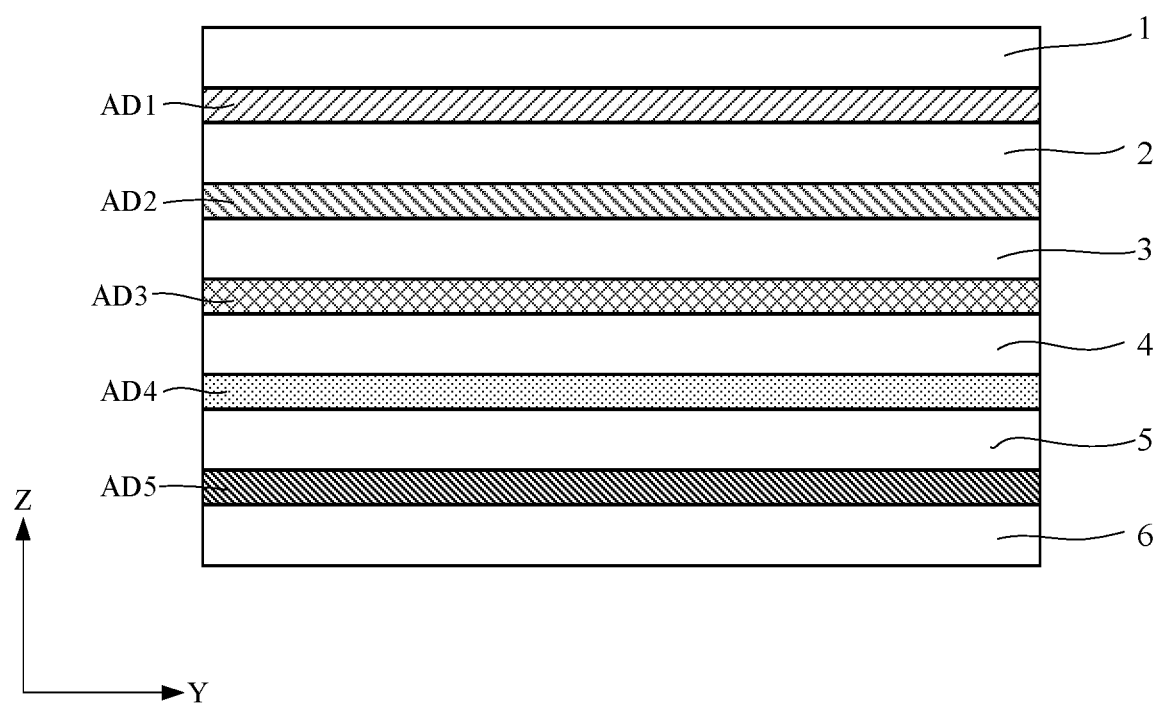
FIG. 4 is a cross-sectional view of a display device according to some exemplary embodiments of the present disclosure.

FIG. 4 is a cross-sectional view of the display device 100 according to some exemplary embodiments of the present disclosure. FIG. 4 shows a cross section defined by the second direction Y and the third direction Z.

Referring to FIG. 4, the display device 100 may include a display element 4, a plurality of functional members, a back film 5, a supporting member 6, and a plurality of adhesive layers.

As shown in FIG. 4, the plurality of functional members are located on a side of the display element 4, for example, on a side of the display element 4 close to the display surface 101. The plurality of functional members are arranged close to the display element in sequence in the Z direction. For the convenience of description, the plurality of functional members are referred to as a first functional member 1, a second functional member 2 and a third functional member 3, respectively. That is, the first functional member 1, the second functional member 2, and the third functional member 3 are sequentially close to the display element 4 in the Z direction. For example, each functional member may be a film layer disposed on the display element 4.

Continuing to refer to FIG. 4, the plurality of adhesive layers may be disposed between any two adjacent ones of the first functional member 1, the second functional member 2, the third functional member 3, the display element 4, the back film 5, and the supporting member 6. For the convenience of description, the plurality of adhesive layers are respectively referred to as a first adhesive layer AD1, a second adhesive layer AD2, a third adhesive layer AD3, a fourth adhesive layer AD4, and a fifth adhesive layer AD5.

The first adhesive layer AD1 is provided between the first functional member 1 and the second functional member 2 so that the first functional member 1 may be attached to the second functional member 2 through the first adhesive layer AD1. The second adhesive layer AD2 is provided between the second functional member 2 and the third functional member 3, so that the second functional member 2 may be attached to the third functional member 3 through the second adhesive layer AD2. The third adhesive layer AD3 is provided between the third functional member 3 and the display element 4, so that the third functional member 3 may be attached to the display element 4 through the third adhesive layer AD3. The fourth adhesive layer AD4 is provided between the display element 4 and the back film 5, so that the display element 4 may be attached to the back film 5 through the fourth adhesive layer AD4. The fifth adhesive layer AD5 is provided between the back film 5 and the supporting member 6, so that the back film 5 may be attached to the supporting member 6 through the fifth adhesive layer AD5.

Figure 5:
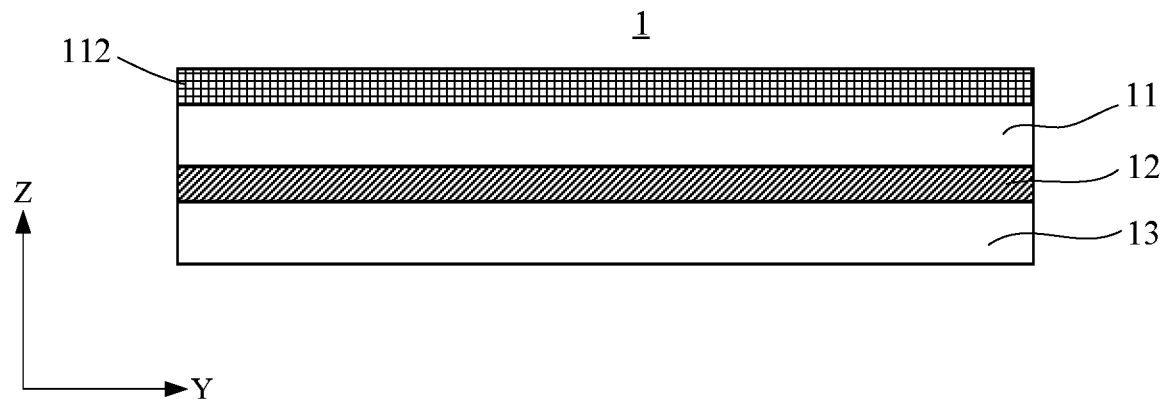
FIG. 5 is a cross-sectional view of a first functional member included in a display device according to some exemplary embodiments of the present disclosure.

In the embodiments of the present disclosure, the first functional member 1 may be a protective film to form a cover plate of the display device 100. FIG. 5 is a cross-sectional view of a first functional member included in a display device according to some exemplary embodiments of the present disclosure. As shown in FIG. 5, the first functional member 1 may include a first protective film 11, an intermediate adhesive layer 12 and a second protective film 13. The first protective film 11 is provided on the upper side, and the second protective film 13 is provided on the lower side, that is, the first protective film 11 is farther away from the display element 4 than the second protective film 13, and the first protective film 11 is formed as an exterior surface of the display device 100. The intermediate adhesive layer 12 is disposed between the first protective film 11 and the second protective film 13 for bonding the first protective film 11 and the second protective film 13.

Optionally, a surface (i.e., the upper surface) of the first protective film 11 away from the second protective film 13 may be coated with a protective coating 112. For example, the protective coating 112 may be an HC coating (that is, hard coating), and the HC coating may be formed by curing a nano hard coating of model No. HC400. In the embodiments of the present disclosure, the breaking elongation of the protective coating 112 is greater than 2.5%.

Specifically, the nano hard coating is coated on the first protective film 11 by a micro-gravure coating roller, and is cured into a film to form the protective coating 112 which has excellent wear resistance and scratch resistance. For example, an upper surface of the first protective film 11 may be corona treated to form a corona treatment layer so that its surface tension is above 56 dyne, and the nano hard coating is coated on the corona treatment layer and is cured to form the protective coating 112, so as to improve a lamination effect between the protective coating 112 and the first protective film 11, thereby preventing the protective coating 112 from falling. Optionally, an upper surface of the protective coating layer 112 is also coated with an acrylic varnish layer, which is hydrophobic and oleophobic, is easy to wipe the surface with oil stain or water without residue, resists oil stains, and has a good cleaning effect. As a result, the sensitivity and accuracy of screen fingerprint unlocking is improved.

In some exemplary embodiments, both the first protective film 11 and the second protective film 13 are transparent, and both the first protective film 11 and the second protective film 13 may be made of polyimide (i.e., PI) material or polyethylene terephthalate (i.e., PET). Their modulus at normal temperature (that is, the modulus at 20° C.) is approximately 6~7 GPa. The thickness of the first protective film 11 may be approximately 75~85 microns (μm), and the sum of the thicknesses of the first protective film 11 and the protective coating 112 may be approximately 80~90 microns.

In some exemplary embodiments, the intermediate adhesive layer 12 may be composed of OCA. Its modulus is approximately: 600~700 KPa (−30° C.) (in this context, it means the modulus at −30° C.), 20~40 KPa (20° C.) (in this context, it means the modulus at 20° C.), 5~25 KPa (60° C.) (in this context, it means the modulus at 60° C.). The thickness of the intermediate adhesive layer 12 may be approximately 40~60 microns.

By setting the structure of the first functional member 1, the thickness and modulus of each film layer, the first functional member 1 has high resilience, high hardness, scratch resistance, and impact resistance, thereby improving the bending reliability and impact resistance of the display device 100.

In the embodiments of the present disclosure, the second functional member 2 may include a polarizing member, for example, a circular polarizer, to polarize light incident thereon. For example, the circular polarizer may include a linear polarizer and a quarter wave plate.

In some exemplary embodiments, the thickness of the second functional member 2 is approximately 60~90 μm, and the modulus at normal temperature is approximately 2~4 GPa.

In the embodiments of the present disclosure, the first adhesive layer AD1 includes OCA which is disposed between the first functional member 1 and the second functional member 2. The material of the first adhesive layer AD1 may be the same as the material of the intermediate adhesive layer 12, for example, both are OCA.

The thickness of the first adhesive layer AD1 may be substantially equal to the thickness of the intermediate adhesive layer 12.

The modulus of the first adhesive layer AD1 may be greater than the modulus of the intermediate adhesive layer 12. For example, the modulus of the first adhesive layer AD1 may be more than two times the modulus of the intermediate adhesive layer 12. In this way, by setting the modulus of the intermediate adhesive layer to be smaller, the stress received by the first functional member 1 may be reduced, thereby reducing the adverse effect of the stress on the overall adhesive layer of the display device. Moreover, by setting the modulus of the first adhesive layer to be greater than the modulus of the intermediate adhesive layer, it is beneficial to reducing the stress on touch panel wirings and the display element under the first adhesive layer.

Specifically, the thickness of the first adhesive layer AD1 may be approximately 40~60 microns, and the modulus may be approximately 80~120 KPa (−30° C.), 40~60 KPa (20° C.), and 20~40 KPa (60° C.).

Figure 6:
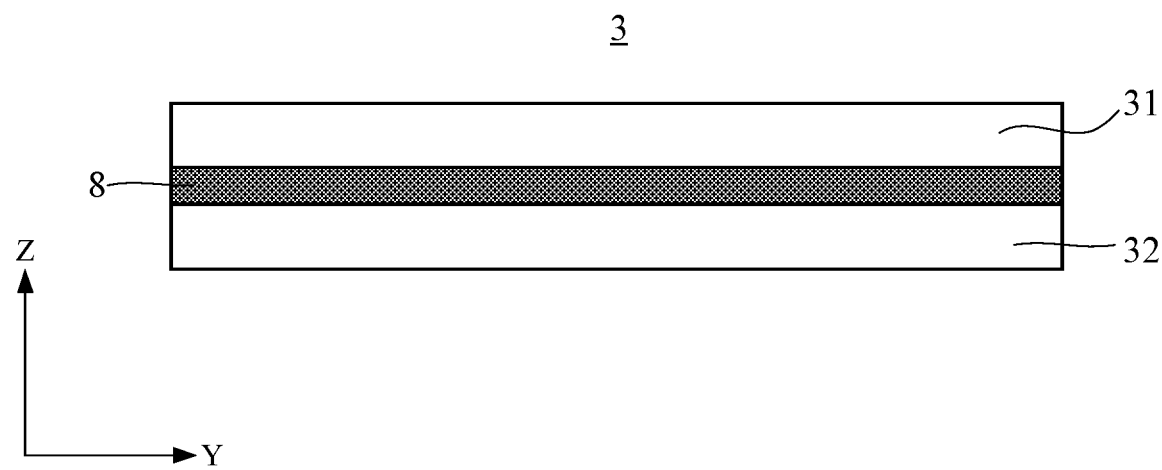
FIG. 6 is a cross-sectional view of a third functional member included in a display device according to some exemplary embodiments of the present disclosure.

In the embodiments of the present disclosure, the third functional member 3 includes a touch module, for example, the third functional member 3 may be a touch panel. FIG. 6 is a cross-sectional view of a third functional member included in a display device according to some exemplary embodiments of the present disclosure. Specifically, referring to FIG. 6, the third functional member 3 includes a touch substrate 32 and a sensor layer 31 provided on the touch substrate 32.

In some exemplary embodiments, the touch substrate 32 may be a COP substrate or a TAC substrate. It should be noted that the COP substrate is mainly composed of COP material, and the TAC substrate is mainly composed of TAC material. It should be understood that the constituent materials of the COP substrate or the TAC substrate have no phase retardation and may be arranged under the circular polarizer 2 without affecting the polarization effect of the circular polarizer 2.

In some exemplary embodiments, the thickness of the touch substrate 32 is about 20~30 microns, and the modulus at normal temperature is about 2~4 GPa. It should be noted that the sensor layer 31 may include a touch driving electrode layer, a touch sensing electrode layer, a touch panel wiring, and an insulating layer. The specific structure thereof may refer to various structures of the existing touch layer, which will not be repeated here.

In the embodiments of the present disclosure, the third functional member 3 further includes an adhesive material layer 8. The adhesive material layer 8 is arranged between the touch substrate 32 and the sensor layer 31.

In some exemplary embodiments, the adhesive material layer 8 may include OCA.

In some exemplary embodiments, the modulus of the adhesive material layer 8 is smaller than that of each of the first protective film 11, the second protective film 13, the second functional member 2, the touch substrate 32, the display element 4, the back film 5, and the supporting member 6. For example, the modulus of the adhesive material layer 8 at normal temperature is smaller than that of each of the first protective film 11, the second protective film 13, the second functional member 2, the touch substrate 32, the display element 4, the back film 5 and the supporting member 6 at normal temperature. For example, the modulus of the adhesive material layer 8 at normal temperature is on the KPa level, and the modulus of each of the first protective film 11, the second protective film 13, the second functional member 2, the touch substrate 32, the display element 4, the back film 5, and the supporting members 6 at normal temperature is on the GPa level.

For example, the modulus of the adhesive material layer 8 is not less than that of each of the intermediate adhesive layer 12, the first adhesive layer AD1, the second adhesive layer AD2, the third adhesive layer AD3, the fourth adhesive layer AD4, and the fifth adhesive layer AD5. The modulus of the adhesive material layer 8 may be substantially equal to the modulus of the second adhesive layer AD2, and the modulus of the adhesive material layer 8 may be more than eight times the modulus of each of the intermediate adhesive layer 12, the first adhesive layer AD1, the third adhesive layer AD3, the four adhesive layers AD4 and the fifth adhesive layer AD5.

For example, the modulus of the adhesive material layer 8 at normal temperature (i.e., 20° C.) is greater than 500 KPa. Specifically, the modulus of the adhesive material layer 8 may be approximately 4500~5500 KPa (−30° C.), 830~930 KPa (20° C.), and 30~50 KPa (60° C.). If the modulus of the adhesive material layer is set too small, for example, its modulus at normal temperature is less than 500 KPa, the adhesive material layer may deform during the bending process, so that the stress on the touch panel wiring may concentrate, increasing the risk of wiring breakage.

By arranging such an adhesive material layer between the touch substrate and the sensor layer, when the display device is impacted (for example, dropped), the adhesive material layer may protect the sensor layer thereon, thereby reducing or avoiding the risk of cracks on the sensor layer, and improving the performance of the display device when subjected to an impact such as drop, that is, increasing the drop reliability of the display device.

In exemplary embodiments, the thickness of the adhesive material layer 8 is not greater than the thickness of each of the intermediate adhesive layer 12, the first adhesive layer AD1, the second adhesive layer AD2, the third adhesive layer AD3, the fourth adhesive layer AD4, and the fifth adhesive layers AD5. For example, the thickness of the adhesive material layer 8 may be substantially equal to the thickness of the second adhesive layer AD2, and the thickness of each of the intermediate adhesive layer 12, the first adhesive layer AD1, the third adhesive layer AD3, the fourth adhesive layer AD4, and the fifth adhesive layer AD5 may be more than two times the thickness of the adhesive material layer 8.

Specifically, the thickness of the adhesive material layer 8 may be about 10~20 microns. In this way, although the adhesive material layer is added into the display device, the thickness of the adhesive material layer is relatively small, thereby avoiding an excessive increase in the thickness of the display device.

In the embodiments of the present disclosure, the second adhesive layer AD2 includes PSA and is disposed between the second functional member 2 and the third functional member 3, specifically, between the second functional member 2 and the sensor layer 31.

In some exemplary embodiments, the modulus of the second adhesive layer AD2 may be substantially equal to the modulus of the adhesive material layer 8. The thickness of the second adhesive layer AD2 may be substantially equal to the thickness of the adhesive material layer 8. Specifically, the thickness of the second adhesive layer AD2 is about 10~20 microns, and the modulus is about 4500~5500 KPa (−30° C.), 830~930 KPa (20° C.), and 30~50 KPa (60° C.).

In the display device 100 provided by the embodiments of the present disclosure, the second adhesive layer AD2 and the adhesive material layer 8 are respectively provided on the upper and lower sides of the sensor layer 31, and the modulus and thickness of the second adhesive layer AD2 are respectively equal to the modulus and thickness of the adhesive material layer 8. With such a matching design, the sensor layer 31 may be better protected, and the risk of crack on the sensor layer may be reduced or avoided, Thereby, the performance of the display device when subjected to an impact such as a drop may be improved, and the drop reliability of the display device may be further improved.

In the embodiments of the present disclosure, the display element 4 may be a display panel, for example, the display panel may be an OLED display panel. It should be noted that the specific structure of the display panel may refer to various structures of the existing display panel, which will not be repeated here.

In the embodiments of the present disclosure, the third adhesive layer AD3 includes OCA and is disposed between the third functional member 3 and the display element 4, specifically, between the touch substrate 32 and the display element 4.

The thickness of the third adhesive layer AD3 may be substantially equal to the thickness of each of the intermediate adhesive layer 12 and the first adhesive layer AD1.

Figure 7:
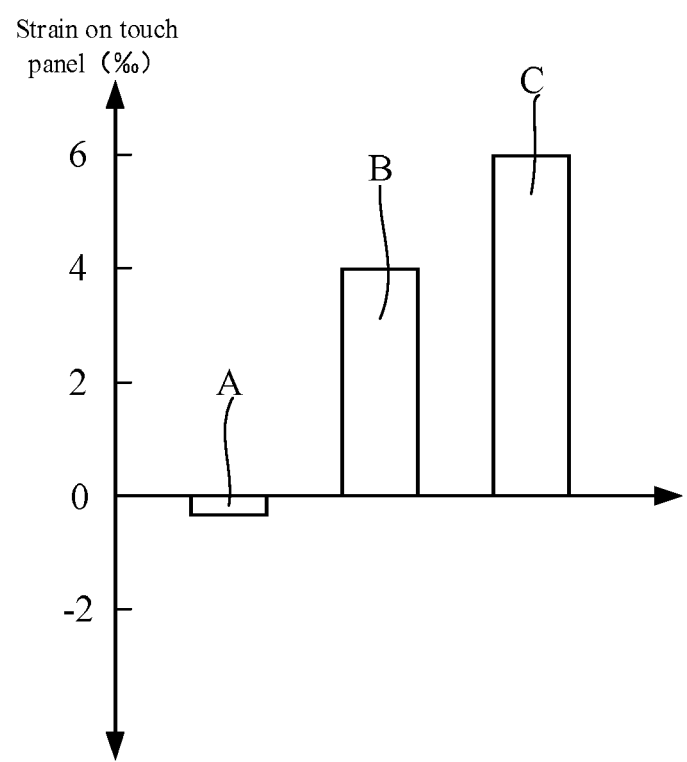
FIG. 7 schematically shows the strain of a touch panel included in a display device according to some exemplary embodiments of the present disclosure under different modulus matching conditions.

The modulus of the third adhesive layer AD3 is smaller than the modulus of the second adhesive layer AD2. For example, the modulus of the second adhesive layer AD2 may be more than eight times the modulus of the third adhesive layer AD3. As shown in FIG. 7, it schematically shows the strain of the touch panel under different modulus matching conditions. Specifically, column A in FIG. 7 represents the strain received by the touch panel under an action of a certain external force under the condition that the modulus of the third adhesive layer AD3 is smaller than the modulus of the second adhesive layer AD2; column B represents the strain received by the touch panel under the action of the external force under the condition that the modulus of the third adhesive layer AD3 is equal to the modulus of the second adhesive layer AD2; column C represents the strain received by the touch panel under the action of the external force under the condition that the modulus of the third adhesive layer AD3 is greater than the modulus of the second adhesive layer AD2. From these comparative experiments, it may be seen that under the condition that the modulus of the third adhesive layer AD3 is smaller than the modulus of the second adhesive layer AD2, the strain received by the touch panel is within a safe range. Therefore, by setting the modulus of the third adhesive layer AD3 to be smaller than the modulus of the second adhesive layer AD2, the touch panel may be prevented from being subjected to greater stress.

Further, the modulus of the third adhesive layer AD3 may be greater than the modulus of each of the intermediate adhesive layer 12, the first adhesive layer AD1, the fourth adhesive layer AD4, and the fifth adhesive layer AD5. For example, the modulus of the third adhesive layer AD3 may be more than two times the modulus of the first adhesive layer AD1, and the modulus of the third adhesive layer AD3 may be more than three times the modulus of each of the intermediate adhesive layer 12, the fourth adhesive layer AD4, and the fifth adhesive layer AD5.

In some exemplary embodiments, the thickness of the third adhesive layer AD3 is about 40~60 microns, and the modulus thereof is about 1800~2200 KPa (−30° C.), 100~120 KPa (20° C.), 60~80 KPa (60° C.).

In the embodiments of the present disclosure, the back film 5 may include a high molecular weight material, such as PI or PET. The back film 5 is provided on a back of the display element 4 away from the display surface 101. The thickness of the back film 5 is about 40~60 microns, and the modulus thereof at normal temperature is about 2~4 GPa.

Referring to FIG. 4, the fourth adhesive layer AD4 includes PSA, and is disposed between the display element 4 and the back film 5 for bonding the display element 4 and the back film 5.

In some exemplary embodiments, the thickness of the fourth adhesive layer AD4 may be less than the thickness of each of the intermediate adhesive layer 12, the first adhesive layer AD1, the third adhesive layer AD3, and the fifth adhesive layer AD5. The modulus of the fourth adhesive layer AD4 may not be greater than the modulus of each the intermediate adhesive layer 12, the first adhesive layer AD1, the second adhesive layer AD2, the adhesive material layer 8, the third adhesive layer AD3, and the fifth adhesive layer AD5. The modulus of the fourth adhesive layer AD4 may be substantially equal to the modulus of each of the intermediate adhesive layer 12 and the fifth adhesive layer AD5, and smaller than the modulus of each of the first adhesive layer AD1, the second adhesive layer AD2, the adhesive material layer 8 and the third adhesive layer AD3.

Specifically, the thickness of the fourth adhesive layer AD4 is approximately 20~30 microns. The modulus of the fourth adhesive layer AD4 is approximately 600~700 KPa (−30° C.), 20~40 KPa (20° C.), and 5~25 KPa (60° C.).

In the embodiments of the present disclosure, the supporting member 6 may include a supporting film composed of a metal material such as SUS stainless steel. The supporting member 6 is arranged on a back of the back film 5 away from the display element 4. The thickness of the supporting member 6 is approximately 25~35 microns, and the modulus thereof at normal temperature is approximately 100~200 GPa. By providing such a supporting member 6, it is beneficial for the display device to return to a flat state after it is bent.

The fifth adhesive layer AD5 includes OCA, and is disposed between the back film 5 and the supporting member 6 for bonding the back film 5 and the supporting member 6.

In some exemplary embodiments, the thickness of the fifth adhesive layer AD5 may be substantially equal to the thickness of each of the intermediate adhesive layer 12, the first adhesive layer AD1, and the third adhesive layer AD3. The modulus of the fifth adhesive layer AD5 may not be greater than the modulus of each of the intermediate adhesive layer 12, the first adhesive layer AD1, the second adhesive layer AD2, the adhesive material layer 8, the third adhesive layer AD3, and the fourth adhesive layer AD4. The modulus of the fifth adhesive layer AD5 may be substantially equal to the modulus of each of the intermediate adhesive layer 12 and the fourth adhesive layer AD4, and smaller than the modulus of each of the first adhesive layer AD1, the second adhesive layer AD2, the adhesive material layer 8 and the third adhesive layer AD3.

Specifically, the thickness of the fifth adhesive layer AD5 is approximately 40~60 microns. The modulus of the fifth adhesive layer AD5 is about 600~700 KPa (−30° C.), 20~40 KPa (20° C.), 5~25 KPa (60° C.).

In some exemplary embodiments, the modulus of the fourth adhesive layer AD4 and the fifth adhesive layer AD5 at normal temperature may be set to be less than 30 KPa. With such an arrangement, an influence of the back film 5 and the supporting member 6 on the force received by the display element 4 may be reduced, so that the force received by the display element 4 is within a safe range, which is beneficial for the display device to pass the reliability test.

In the embodiments of the present disclosure, by coordinating the modulus and/or thicknesses of various film layers and adhesive layers, it is possible to ensure that the wiring layer of the touch panel and the devices on the display panel are subjected to the stress within a safe range. It may avoid defects such as deformation and film separation during the bending process, and may also avoid defect such as air bubbles. Therefore, the flexible display device according to the embodiments of the present disclosure may pass the bending reliability test, and may meet the user's requirements.

Embodiments of the present disclosure also provide an electronic device, which includes the display device provided in any of the foregoing embodiments. For example, the electronic device may include a smart phone, a portable phone, a navigation device, a television (TV), a car stereo, a laptop computer, a tablet computer, a portable multimedia player (PMP), a personal digital assistant (PDA), and so on. The electronic device may be configured as a pocket-sized portable communication terminal with a wireless communication function.

As used herein, terms "substantially", "about", "approximately" and similar terms are used as approximate terms rather than degree terms, and are intended to take into account the inherent deviation of the measured or calculated value that those skilled in the art would recognize. Unless otherwise specified, the terms "substantially", "about", "approximately" and similar terms may mean to be within one or more standard deviations, within ±5% of the stated value. For another example, when this type of terms modifies a numerical point, it means that it may float 5% above and below that numerical point; when this type of terms modifies a numerical range, it means that it may float 5% above and below each end of the numerical range.

Furthermore, any numerical range recited herein is intended to include all sub-ranges of the same numerical precision that fall within the recited range. For example, the range of "1.0 to 10.0" is intended to include all sub-ranges between the listed minimum value of 1.0 and the listed maximum value of 10.0 (and includes the listed minimum value of 1.0 and the listed maximum value of 10.0), that is, all sub-ranges having a minimum value greater than or equal to 1.0 and a maximum value less than or equal to 10.0, for example, 2.4 to 7.6. Any maximum numerical limit recited herein is intended to include all lower numerical limits subsumed therein, and any minimum numerical limit recited in this specification is intended to include all larger numerical limits subsumed therein. Therefore, the applicant reserves the right to modify this specification (including the claims) to clearly list any sub-ranges that fall into the scope explicitly listed in this context.

Although some embodiments of the general technical concept of the present disclosure have been shown and described, those skilled in the art will understand that changes may be made to these embodiments without departing from the principle and spirit of the general technical concept. The scope of the present disclosure shall be defined by the claims and their equivalents.

What is claimed is:

1. A flexible display device, comprising:
   a flexible display panel;
   a plurality of functional members on a side of the flexible display panel, wherein the plurality of functional members comprises a first functional member, a second functional member, and a third functional member, wherein the first functional member, the second functional member and the third functional member are sequentially stacked on the flexible display panel, and the third functional member is closer to the flexible display panel than the first functional member;
   a back film on the other side of the flexible display panel;
   a supporting member on a side of the back film away from the flexible display panel; and
   a plurality of adhesive layers, the plurality of adhesive layers comprising:
   a first adhesive layer between the first functional member and the second functional member;
   a second adhesive layer between the second functional member and the third functional member;
   a third adhesive layer between the third functional member and the flexible display panel;
   a fourth adhesive layer between the flexible display panel and the back film; and
   a fifth adhesive layer between the back film and the supporting member,
   wherein the third functional member comprises a touch module, and the touch module comprises a touch substrate, a sensor layer on the touch substrate, and an adhesive material layer between the sensor layer and the touch substrate, and
   wherein a modulus of the adhesive material layer is not less than a modulus of each of the first adhesive layer, the second adhesive layer, the third adhesive layer, the fourth adhesive layer and the fifth adhesive layer;
   wherein the first functional member comprises a first protective film, a second protective film, and an intermediate adhesive layer between the first protective film and the second protective film, and a modulus of the intermediate adhesive layer is less than the modulus of the adhesive material layer.

2. The flexible display device according to claim 1, wherein the modulus of the adhesive material layer is more than eight times the modulus of each of the first adhesive layer, the third adhesive layer, the fourth adhesive layer and the fifth adhesive layer.

3. The flexible display device according to claim 1, wherein the modulus of the adhesive material layer is equal to the modulus of the second adhesive layer.

4. The flexible display device according to claim 1, wherein the modulus of the adhesive material layer at 20° C. is greater than 500 KPa.

5. The flexible display device according to claim 4, wherein the modulus of the adhesive material layer at 20° C. is approximately in a range of 830~930 KPa.

6. The flexible display device according to claim 1, wherein the modulus of the third adhesive layer is less than the modulus of the second adhesive layer.

7. The flexible display device according to claim 1, wherein the modulus of the first adhesive layer is greater than the modulus of the intermediate adhesive layer.

8. The flexible display device according to claim 1, wherein the modulus of the third adhesive layer is greater than the modulus of each of the intermediate adhesive layer, the first adhesive layer, the fourth adhesive layer and the fifth adhesive layer.

9. The flexible display device according to claim 1, wherein the modulus of the intermediate adhesive layer, the modulus of the fourth adhesive layer, and the modulus of the fifth adhesive layer are equal to one another.

10. The flexible display device according to claim 1, wherein the modulus of the fourth adhesive layer at 20° C. and the modulus of the fifth adhesive layer at 20° C. are both less than 30 KPa.

11. The flexible display device according to claim 9, wherein the modulus of the third adhesive layer at 20° C. is approximately in a range of 100~120 KPa; and/or the modulus of the first adhesive layer at 20° C. is approximately in a range of 40~60 KPa; and/or the modulus of each of the intermediate adhesive layer, the fourth adhesive layer, and the fifth adhesive layer at 20° C. is approximately in a range of 20~40 KPa.

12. The flexible display device according to claim 1, wherein each of the intermediate adhesive layer, the first adhesive layer, the adhesive material layer, the third adhesive layer, and the fifth adhesive layer comprises a transparent optical adhesive; and/or each of the second adhesive layer and the fourth adhesive layer comprises a pressure-sensitive adhesive.

13. The flexible display device according to claim 1, wherein a thickness of the adhesive material layer is not greater than a thickness of each of the intermediate adhesive layer, the first adhesive layer, the second adhesive layer, the third adhesive layer, the fourth adhesive layer, and the fifth adhesive layer.

14. The flexible display device according to claim 13, wherein the thickness of each of the intermediate adhesive layer, the first adhesive layer, the third adhesive layer, the fourth adhesive layer, and the fifth adhesive layer is more than two times the thickness of the adhesive material layer.

15. The flexible display device according to claim 13, wherein the thickness of the adhesive material layer is equal to the thickness of the second adhesive layer.

16. The flexible display device according to claim 13, wherein the thickness of each of the adhesive material layer and the second adhesive layer is approximately in a range of 10~20 microns; and/or the thickness of each of the intermediate adhesive layer, the first adhesive layer, the third adhesive layer, and the fifth adhesive layer is approximately in a range of 40~60 microns; and/or the thickness of the fourth adhesive layer is approximately in a range of 20~30 microns.

17. The flexible display device according to claim 1, wherein a material of the touch substrate comprises cyclic olefin copolymer or tri-cellulose acetate, a thickness of the touch substrate is approximately in a range of 20~30 microns, and a modulus of the touch substrate at 20° C. is approximately in a range of 2~4 GPa; and/or the second functional member comprises a polarizer, a thickness of the polarizer is approximately in a range of 60~90 microns, and a modulus of the polarizer at 20° ° C. is approximately in a range of 2~4 GPa; and/or, the back film comprises polyimide material or polyethylene terephthalate material, a thickness of the back film is approximately in a range of 40~60 microns, and a modulus of the back film at 20° C. is approximately in a range of 2~4 GPa; and/or, the supporting member comprises metal material, the thickness of a supporting member is approximately in a range of 25~35 microns, and a modulus of the supporting member at 20° C. is approximately in a range of 100~200 GPa.

18. The flexible display device according to claim 1, wherein the first protective film and the second protective film comprise polyimide material or polyethylene terephthalate material, a thickness of the first protective film is approximately in a range of 75~85 microns, and a modulus of the first protective film at 20° C. is approximately in a range of 6~7 GPa.

19. An electronic device comprising the flexible display device according to claim 1.

* * * * *